(12) United States Patent
Chang et al.

(10) Patent No.: US 11,227,975 B2
(45) Date of Patent: Jan. 18, 2022

(54) SEMICONDUCTOR STRUCTURE HAVING A BRIDGE LAYER

(71) Applicant: EPISTAR CORPORATION, Hsinchu (TW)

(72) Inventors: Yung-Fu Chang, Hsinchu (TW); Fan-Lei Wu, Hsinchu (TW); Shih-Chang Lee, Hsinchu (TW); Wen-Luh Liao, Hsinchu (TW); Hung-Ta Cheng, Hsinchu (TW); Chih-Chaing Yang, Hsinchu (TW); Yao-Ru Chang, Hsinchu (TW); Yi Hsiao, Hsinchu (TW); Hsiang Chang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 16/549,822

(22) Filed: Aug. 23, 2019

(65) Prior Publication Data

US 2020/0075807 A1 Mar. 5, 2020

(30) Foreign Application Priority Data

Aug. 28, 2018 (TW) .................................. 107130027

(51) Int. Cl.
*H01L 33/20* (2010.01)
(52) U.S. Cl.
CPC .................................... *H01L 33/20* (2013.01)
(58) Field of Classification Search
CPC ..................................................... H01L 33/20

USPC .......................................................... 257/618
See application file for complete search history.

(56) References Cited

U.S. PATENT DOCUMENTS

| | | | | |
|---|---|---|---|---|
| 8,338,837 | B2* | 12/2012 | Yeh | H01L 27/156 |
| | | | | 257/88 |
| 9,368,683 | B1 | 6/2016 | Meitl et al. | |
| 9,666,677 | B1* | 5/2017 | Raring | H01L 27/0676 |
| 9,799,794 | B2 | 10/2017 | Bower et al. | |
| 10,249,795 | B2* | 4/2019 | Van Delft | H01L 27/15 |
| 10,608,071 | B2* | 3/2020 | Hong | H01L 27/3262 |
| 2008/0185030 | A1* | 8/2008 | Pierce | H01L 35/32 |
| | | | | 136/203 |
| 2009/0008654 | A1* | 1/2009 | Nagai | H01L 25/0753 |
| | | | | 257/88 |
| 2009/0194830 | A1* | 8/2009 | Ransley | H03H 9/2463 |
| | | | | 257/415 |
| 2010/0102403 | A1* | 4/2010 | Celik-Butler | H01L 21/0237 |
| | | | | 257/415 |
| 2011/0101475 | A1* | 5/2011 | Parpia | B81C 1/00246 |
| | | | | 257/417 |
| 2012/0217511 | A1* | 8/2012 | Renaud | H01L 29/66462 |
| | | | | 257/76 |

(Continued)

*Primary Examiner* — Alexander O Williams
(74) *Attorney, Agent, or Firm* — Ditthavong, Steiner & Mlotkowski (57) ABSTRACT

A semiconductor structure includes a carrier having a surface, a supporting element, a semiconductor stack and a bridge layer. The supporting element is on the surface. The semiconductor stack is on the surface and has a side surface. The bridge layer includes a first portion connecting to the supporting element, a second portion, and a third portion connecting to the semiconductor stack. The second portion is extended from the third portion toward the first portion and is protruded from the side surface.

20 Claims, 11 Drawing Sheets

(56) References Cited

U.S. PATENT DOCUMENTS

| | | | |
|---|---|---|---|
| 2015/0144870 A1* | 5/2015 | An | H01L 33/0025 |
| | | | 257/13 |
| 2015/0229108 A1* | 8/2015 | Steigerwald | H01S 5/04253 |
| | | | 372/45.01 |
| 2016/0343666 A1* | 11/2016 | Deshpande | H01L 25/0655 |
| 2016/0372893 A1* | 12/2016 | McLaurin | H01S 5/32341 |
| 2017/0025567 A1* | 1/2017 | Lu | H01L 27/153 |
| 2017/0271421 A1* | 9/2017 | Jinbo | H01L 27/3258 |
| 2018/0006186 A1 | 1/2018 | Bowers et al. | |
| 2018/0040548 A1* | 2/2018 | Kim | H01L 25/0657 |
| 2020/0075546 A1* | 3/2020 | Shih | H01L 23/3128 |
| 2020/0176383 A1* | 6/2020 | Arvin | H01L 21/563 |

\* cited by examiner

SEMICONDUCTOR STRUCTURE HAVING A BRIDGE LAYER

CROSS REFERENCE TO RELATED APPLICATIONS

This application claims the right of priority based on TW Application Serial No. 107130027, filed on Aug. 28, 2018, and the content of which is hereby incorporated by reference in its entirety.

FIELD OF DISCLOSURE

The present disclosure relates to a semiconductor structure which may include a light-emitting diode and in particular to a semiconductor device for transferring a light-emitting diode.

BACKGROUND OF THE DISCLOSURE

Light-emitting diodes (LEDs) have advantages such as low energy consumption, low heat production, long operating lifetime, strong collision resistance, small size and quick speed of response, and are widely used in various fields where a lighting device is needed, for example, vehicles, home appliances, displays and light fixtures.

Since a light-emitting diode may generate a monochromatic light, it can be used for forming a pixel in a display. For example, pixels in an out-door display or an in-door display. Recently, increasing the display resolution has become a trend in developing display technologies. In order to increase the resolution, transferring more LEDs (or pixels) onto a target substrate may be required, and some technical problems are remained to be solved.

SUMMARY OF THE DISCLOSURE

A semiconductor structure includes a carrier having a surface, a supporting element, a semiconductor stack and a bridge layer. The supporting element is on the surface. The semiconductor stack is on the surface and has a side surface. The bridge layer includes a first portion connecting to the supporting element, a second portion, and a third portion connecting to the semiconductor stack. The second portion is extended from the third portion toward the first portion and is protruded from the side surface.

A semiconductor structure includes a bridge layer and a semiconductor stack. The bridge layer includes a first connecting portion and a second connecting portion. The semiconductor stack is on the first connecting portion and has a side surface and comprising an active layer. The first connecting portion has a first length. The second connecting portion has a second length less than the first width. The second connecting portion is extended from the first connecting portion and is protruded from the side surface.

A semiconductor structure includes a carrier having a surface, a plurality of semiconductor devices, a supporting element, a semiconductor stack and a bridge layer. The plurality of semiconductor devices is on the surface. The semiconductor devices form an array. Each of the semiconductor devices includes a supporting element, a semiconductor stack having a side surface, and a bridge layer. The bridge layer has a first portion connecting to the supporting element, a second portion, and a third portion connecting to the semiconductor stack. The second portion is extended from the third portion toward the first portion. The second portion is protruded from the side surface.

DETAILED DESCRIPTION OF THE DISCLOSURE

The following embodiments will be described with accompany drawings to disclose the concept of the present disclosure. In the drawings or description, same or similar portions are indicated with same numerals. Furthermore, a shape or a thickness of a component in the drawings may be enlarged or reduced. Particularly, it should be noted that a component which is not illustrated or described in drawings or description may be in a form that is known by a person skilled in the art. To describe the present disclosure in a clear and concise manner, repeated descriptions of same or similar elements may be omitted in the embodiments.

Figure 1:
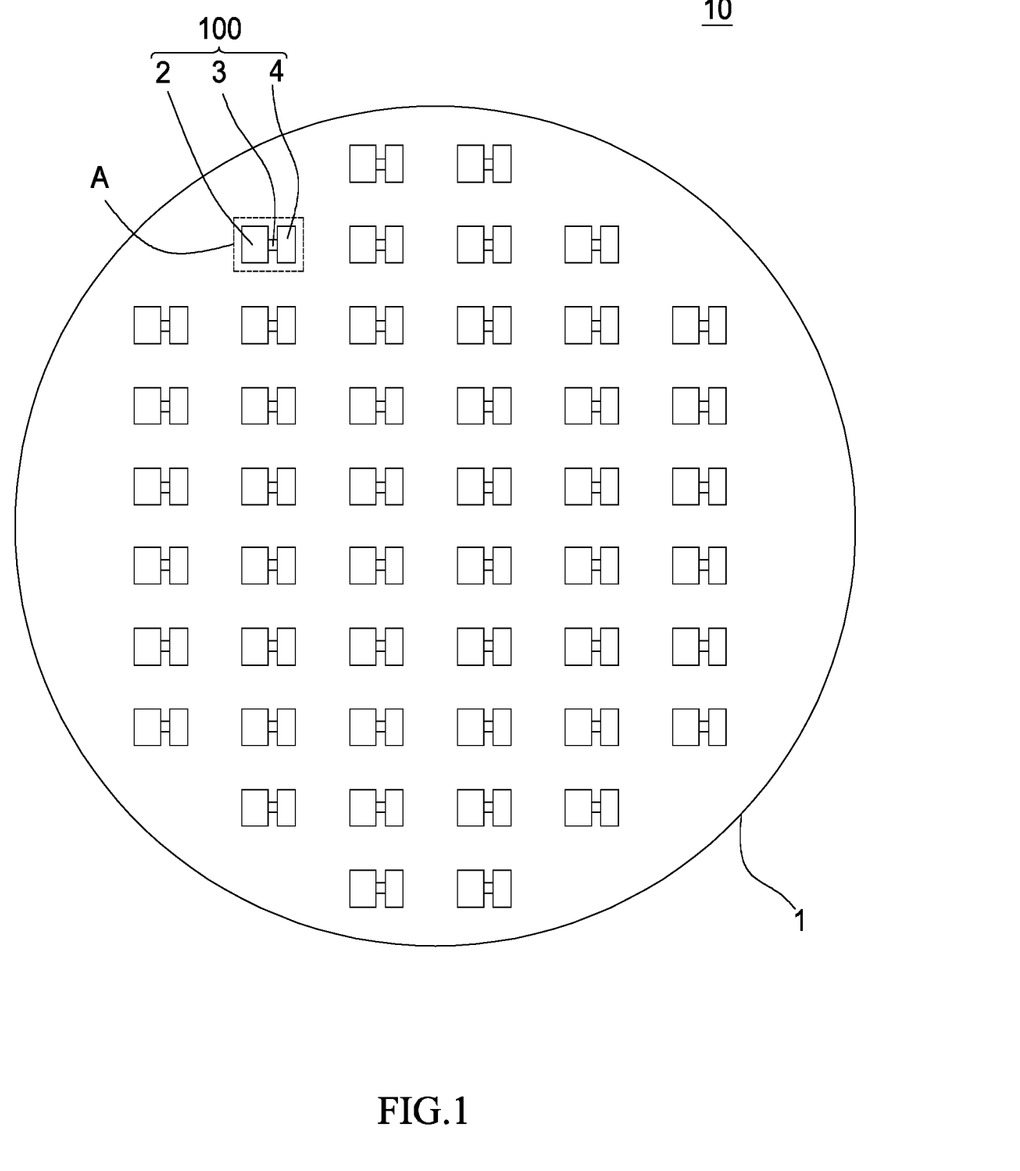
FIG. 1 shows a schematic top view of a semiconductor structure in accordance with an embodiment of the present disclosure.
Figure 2A:
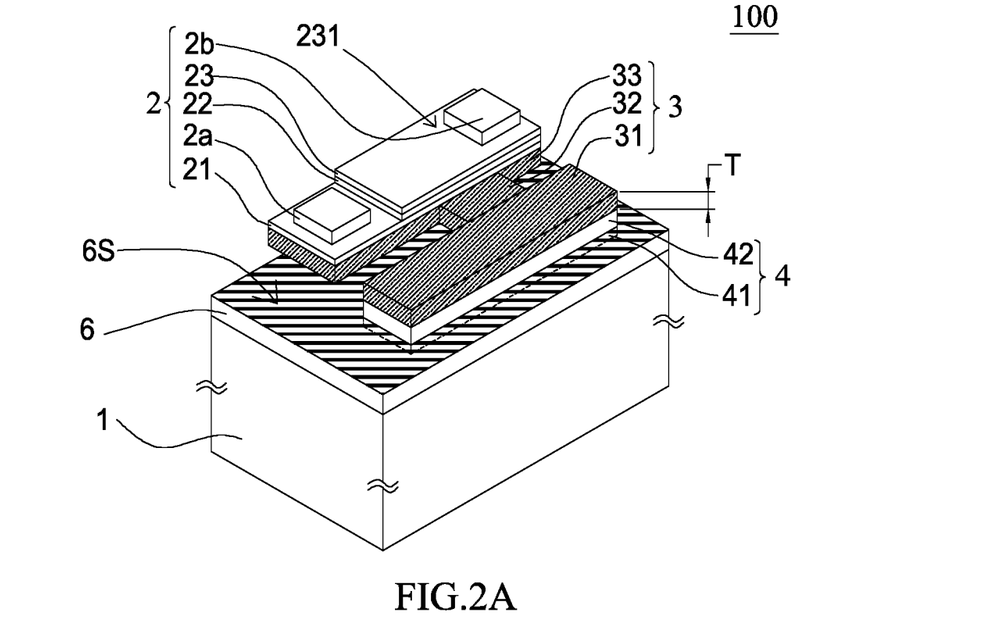
FIG. 2A shows a schematic view of a semiconductor device in region A of FIG. 1 in accordance with an embodiment of the present disclosure.
Figure 2B:
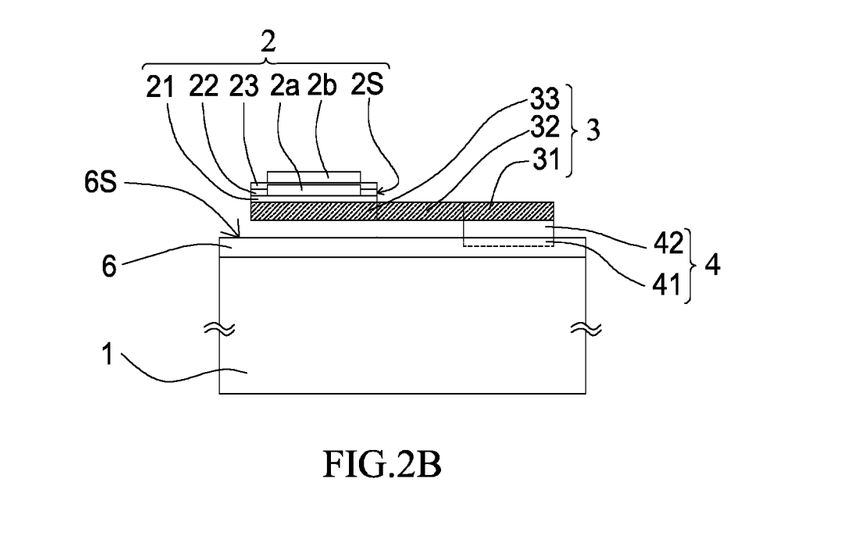
FIG. 2B shows a schematic side view of the semiconductor device in FIG. 2A in accordance with an embodiment of the present disclosure.

FIG. 1 shows a schematic top view of a semiconductor structure 10 in accordance with an embodiment of the present disclosure. FIG. 2A shows a schematic view of the semiconductor device 100 in the region A of FIG. 1. FIG. 2B shows a schematic side view of the semiconductor device 100 in FIG. 2A. As shown in FIG. 1 and FIGS. 2A-2C, a plurality of semiconductor devices 100 forms an array and is fixed on a carrier 1. Each of the semiconductor devices 100 may have the same structure. The semiconductor device 100 may include a bonding structure 6, a semiconductor light-emitting device 2, a supporting element 4, and a bridge layer 3. The bonding structure 6 is located on the carrier 1 and has a surface 6S. The supporting element 4 is formed on a side of the semiconductor light-emitting device 2. The bridge layer 3 is connected to the semiconductor light-emitting device 2 and the supporting element 4. The supporting element 4 is fixed on the bonding structure 6 and may have a first part 41 and a second part 42 on the first part 41. The first part 41 is buried in the bonding structure 6 such that an adhesion force between the supporting element 4 and the bonding structure 6 may be enhanced. The second part 42 may protrude from the surface 6S. The bridge layer 3 may include a first portion 31, a second portion 32, and a third portion 33. The first portion 31 is on the supporting element 4 and is connected to the second part 42 of the supporting element 4. The second portion 32 and the third portion 33 may extend from the first portion 31 and may extend over the supporting element 4. The second portion 32 and the third portion 33 are not directly connected with the surface 6S, and are suspended above the surface 6S. That is, there is no solid supporting material between the second portion 32 and the surface 6S or between the third portion 33 and the surface 6S of the bonding structure 6. The first portion 31, the second portion 32, and the third portion 33 may be formed by the same material and may have the same thickness. The semiconductor light-emitting device 2 is located on the third portion 33.

The carrier 1 may support the semiconductor light-emitting device 2 and may also support other stacks or structures formed on the carrier 1. A material of the carrier 1 may include metal, oxide, semiconductor, diamond-like carbon (DLC) film, graphite, carbon fiber, or matrix composite. The carrier 1 may have a thickness of 200 μm or more, such that the carrier 1 can endure a stress generated in a manufacturing process for the semiconductor device 100 or in a pick-up process of a plurality of semiconductor light-emitting devices 2. The pick-up process of the semiconductor light-emitting devices 2 is described in later paragraphs.

The bonding structure 6 may cover the carrier 1 and the plurality of supporting elements 4 which forms an array may be fixed by the bonding structure 6. The bonding structure 6 may include a single layer or multiple layers and may have a thickness between 1 μm and 10 μm. The bonding structure 6 may include an organic material or an inorganic material. The organic material may include BCB, COC, fluorocarbon polymer, PI, or PFCB. The inorganic material may include oxide, nitride or metal. For example, the oxide includes aluminum oxide ($Al_xO$), silicon oxide ($SiO_x$), indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), zinc oxide (ZnO), gallium phosphide (GaP), indium cerium oxide (ICO), indium tungsten oxide (IWO), indium titanium oxide (InTiO), indium zinc oxide (IZO), indium gallium oxide (IGO), gallium and aluminum co-doped zinc oxide (GAZO) or a combination thereof. The nitride may include silicon nitride ($SiN_x$) or aluminum nitride ($AlN_x$). The metal may include In, Ti, Pt, W, Cu, Al, Sn, Au, Ag, Pb, Ni or an alloy thereof.

In an embodiment, the bonding structure 6 includes a first diffusion barrier layer, a second diffusion barrier layer, and an alloy layer located between the first diffusion barrier layer and the second diffusion barrier layer (not shown). The alloy layer may include In, Ti, Cu, Al, Sn, Au, Ag, Pb, or Ni. The first diffusion barrier layer and the second diffusion barrier layer may include Ti, Pt, W, or an alloy thereof. The diffusion of a material in the alloy layer to the carrier 1 and/or the supporting element 4 may be prevented by the presence of the first diffusion barrier layer and/or the second diffusion barrier layer. In another embodiment, the bonding structure 6 may be a transparent structure and may be composed of a single layer or multiple layers.

A material of the supporting element 4 may include metal, oxide or nitride. In this embodiment, the material of the supporting element 4 includes Au, Cr, or the alloy thereof (Au/Cr). The supporting element 4 may have a thickness between 1 μm and 11 μm. The first part 41 of the supporting element 4 may have a thickness less than a thickness of the bonding structure 6. Specifically, the thickness of the first part 41 may be less than 1 μm, and the thickness of the second part 42 that is protruded from the surface 6S may be in a range of 1 μm to 10 μm.

Figure 2C:
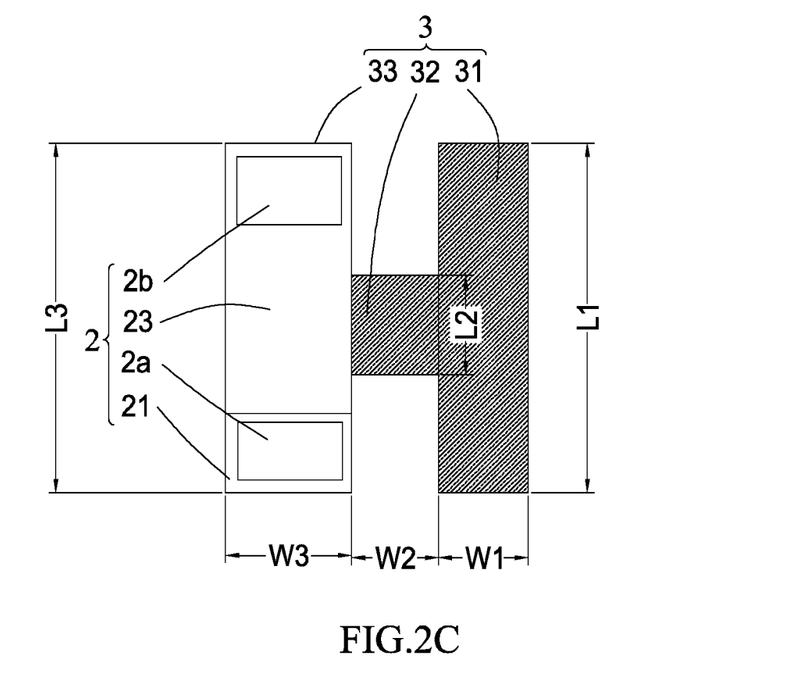
FIG. 2C shows a schematic top view of a bridge layer and a semiconductor light-emitting device in accordance with an embodiment of the present disclosure.

FIG. 2C shows a schematic top view of the bridge layer 3 and the semiconductor light-emitting device 2. The first portion 31 of the bridge layer 3 may connect to the supporting element 4. The first portion 31 and the supporting element 4 may have the same shape. The third portion 33 may connect to the semiconductor light-emitting device 2, and the third portion 33 and the semiconductor light-emitting device 2 may have the same shape. In this embodiment, the first portion 31 of the bridge layer 3 and the supporting element 4 have a rectangular shape. The rectangular shape may have a width W1 and a length L1. In an embodiment, the width W1 and the length L1 are respectively between 1 μm and 1 mm. In another embodiment, the width W1 and the length L1 are respectively between 10 μm and 100 μm. As shown in FIG. 2B, the second portion 32 and the third portion 33 of the bridge layer 3 may extend from the first portion 31 toward the semiconductor light-emitting device 2. The semiconductor light-emitting device 2 may overlap with the third portion 33. The second portion 32 may connect to the third portion 33 and may protrudes from a side surface 2S of the semiconductor light-emitting device 2. From a top view (as shown in FIG. 2C), the third portion 33 has a width W3 and a length L3. The width W3 may be the same as or different from the width W1 of the first portion 31. The length L3 may be the same as or different from the length L1 of the first portion 31. The second portion 32 is located between the first portion 31 and the third portion 33, and connects the third portion 33 and the first portion 31. The second portion 32 may have a length L2 less than the length L1 of the first portion. In an embodiment, the length L2 may be between 1 μm and 50 μm. In an embodiment, a ratio of the length L2 and the length L1 is between 0.1 and 0.5.

Referring to FIG. 2A, the first portion 31, the second portion 32, and the third portion 33 of the bridge layer 3 may have the same thickness T. The thickness T may be less than the length L2 of the second portion 32. In an embodiment, a ratio of the thickness T and the length L2 is between 0.05 and 1. A thickness of the bridge layer 3 may be between 1

μm and 10 μm. The length L2 of the bridge layer 3 may be less than length L1, and the thickness T may be less than the length L2.

Figure 3:
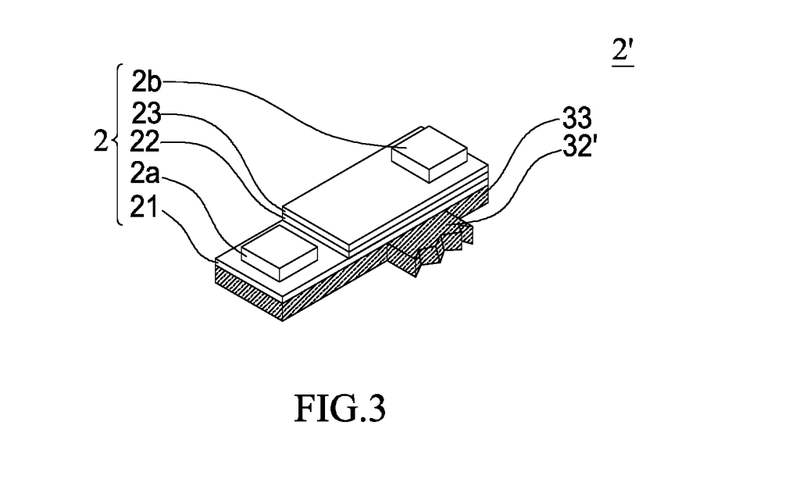
FIG. 3 shows a schematic view of a light-emitting unit in accordance with an embodiment of the present disclosure.

In a subsequent pick-up process, an external force can be applied on the semiconductor light-emitting device 2 to break the bridge layer 3, such that the semiconductor light-emitting device 2 may be separated from the supporting element 4. Then, the semiconductor light-emitting device 2 may be placed on another carrier for forming a display device. Specifically, when a pulling force is applied on the semiconductor light-emitting device 2, the second portion 32 may break easily since the first portion 31 is connected to the supporting element 4, the thickness T of the second portion 32 is less than the length L2, and/or the length L2 is less than length L1, such that the third portion 33 can also be picked up along with the semiconductor light-emitting device 2. As shown in FIG. 3, the picked semiconductor light-emitting device 2, the third portion 33 and a remained portion 32' forms a light-emitting unit 2'. Specifically, the remained portion 32' may be a residue of the second portion which remains on an edge of the third portion 33. The light-emitting unit 2' can be further placed on a carrier such as a circuit board, a panel having a TFT switch, or a flexible substrate for producing a display device. Furthermore, an etching process may be optionally performed to remove the bridge layer remained in the light-emitting unit 2' (for example, the third portion 33 and the remained portion 32' of the second portion). The etching process may be performed before or after placing the light-emitting unit 2' on the carrier.

In another embodiment, the picked semiconductor light-emitting device 2 and the third portion 33 forms a light-emitting unit which can be further placed on a carrier. In other words, the light-emitting unit does not include the second portion 32 of the bridge layer 3. Similarly, an etching process can be optionally performed to remove the bridge layer in the light-emitting unit (for example, the third portion 33).

A material of the bridge layer 3 may include oxide or nitride. The oxide may include aluminum oxide ($Al_xO$), silicon oxide ($SiO_x$), indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), zinc oxide (ZnO), gallium phosphide (GaP), indium cerium oxide (ICO), indium tungsten oxide (IWO), indium titanium oxide (InTiO), indium zinc oxide (IZO), indium gallium oxide (IGO), gallium and aluminum co-doped zinc oxide (GAZO) or a combination thereof. The nitride may include silicon nitride ($SiN_x$) or aluminum nitride ($AlN_x$).

The semiconductor light-emitting device 2 may be located on the bridge layer 3 and directly connected to the third portion 33. The semiconductor light-emitting device 2 may include a semiconductor stack. The semiconductor stack may include a first semiconductor layer 21 on the third portion 33, an active layer 22 on the first semiconductor layer 21, and a second semiconductor layer 23 on the active layer 22. A portion of the first semiconductor layer 21 may be exposed from the second semiconductor layer 23 and the active layer 22. A first electrode 2a may be located on the first semiconductor layer 21, and a second electrode 2b may be located on the second semiconductor layer 23. The first semiconductor layer 21 and the second semiconductor layer 23 are of different conductivity types, so as to respectively provide electrons and holes. A recombination process of electrons and holes may occur in the active layer 22 and a light can be emitted. When the first semiconductor layer 21 includes a p-type III-V semiconductor material, the second semiconductor layer 23 includes an n-type III-V semiconductor material. When the second semiconductor layer 23 includes a p-type III-V semiconductor material, the first semiconductor layer 21 includes an n-type semiconductor material. The first semiconductor layer 21 or the second semiconductor layer 23 may include a dopant such as Zn, C, or Mg, so as to form a p-type semiconductor material. The first semiconductor layer 21 or the second semiconductor layer 23 may include a dopant such as Si or Te, so as to form an n-type semiconductor material. A concentration of the dopant may be between $5\times10^{16}$ $cm^{-3}$ and $5\times10^{19}$ $cm^{-3}$.

In an embodiment, a thickness of the first semiconductor layer 21 is between 0.1 μm and 2 μm, preferably between 0.1 μm and 1.5 μm. A thickness of the second semiconductor layer 23 may be between 0.1 μm and 2 μm, preferably between 0.1 μm and 1.5 μm. A total thickness of the first semiconductor layer 21, the active layer 22, and the second semiconductor layer 23 may be between 1 μm and 10 μm, preferably between 1 μm and 5 μm, so as to comply with a specification required for a downstream application such as pixels for a display. The active layer 22 may include a plurality of well layers and barrier layers alternately stacked with each other. The well layer and the barrier layer may include an III-V semiconductor material. Based on the material of the well layer, the semiconductor light-emitting device 2 may emit an infrared light with a peak wavelength between 700 nm and 1700 nm, a red light with a peak wavelength between 610 nm and 700 nm, a yellow light with a peak wavelength between 530 nm and 570 nm, a green light with a peak wavelength between 490 nm and 550 nm, a blue light or a deep blue light with a peak wavelength between 400 nm and 490 nm, or a UV light with a peak wavelength between 250 nm and 400 nm. A light exit surface 231 of the second semiconductor layer 23 may be a roughened surface (not shown) so as to reduce total internal reflection and to improve a luminous efficiency of the semiconductor light-emitting device 2.

Figure 4A:
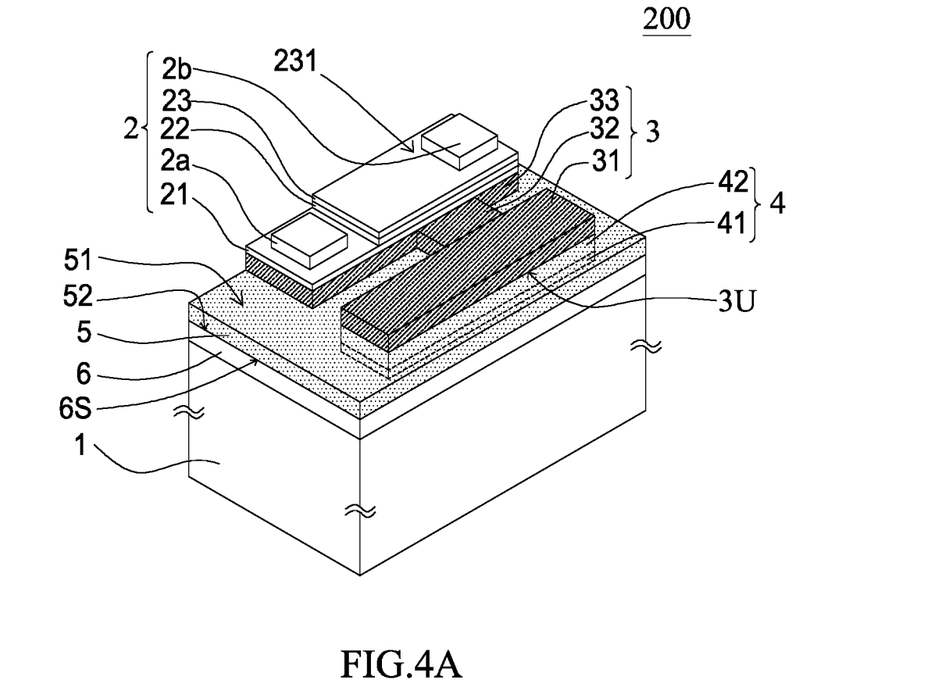
FIG. 4A shows a schematic view of a semiconductor device in accordance with an embodiment of the present disclosure.
Figure 4B:
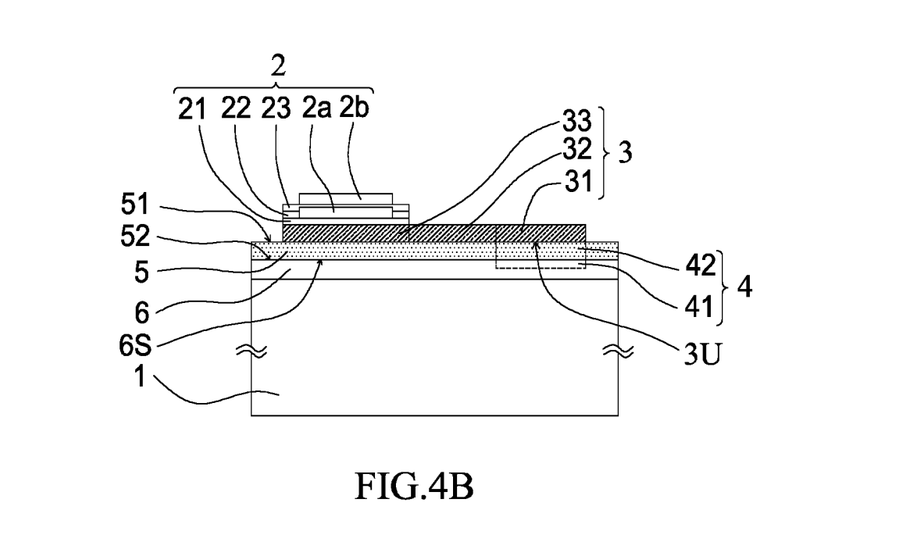
FIG. 4B shows a schematic side view of the semiconductor device in FIG. 4A in accordance with an embodiment of the present disclosure.

FIG. 4A shows a schematic view of a semiconductor device 200 in accordance with an embodiment of the present disclosure. FIG. 4B shows a schematic side view of the semiconductor device 200 in FIG. 4A. Only a single semiconductor device 200 is shown in FIG. 4A. However, referring to the schematic top view shown in FIG. 1, a plurality of semiconductor devices 200 may form an array and may be fixed on the carrier 1 in an embodiment. The semiconductor device 200 may have a similar structure with semiconductor device 100. A difference between the semiconductor device 200 and the semiconductor device 100 is that a sacrificial layer 5 is formed between the bonding structure 6 and the bridge layer 3 in the semiconductor device 200. Specifically, the sacrificial layer 5 may have a lower surface 52 which directly contacts the surface 6S of the bonding structure 6, and the sacrificial layer 5 may have an upper surface 51 which directly contacts a lower surface 3U of the bridge layer 3. The bridge layer 3 may be formed on the sacrificial layer 5, and the second part 42 of the supporting element 4 is completely buried in the sacrificial layer 5.

In practical application, the sacrificial layer 5 can be removed by a dry etching (such as gas etching) or a wet etching process, such that the second portion 32 and the third portion 33 of the bridge layer 3 can be suspended above the surface 6S of the bonding structure 6, then a pick-up process may be performed. After removing the sacrificial layer 5, the surface 6S of the bonding structure 6 and the second part 42 of the supporting element 4 may be exposed. The final structure may be referred to the structure of the semiconductor device 100.

Since the production of the semiconductor device 100 and the pick-up process of the semiconductor light-emitting device 2 may be performed in different places, the sacrificial layer 5 can support the semiconductor light-emitting device 2 on the third portion 33 of the bridge layer 3, so as to avoid the detachment of the semiconductor light-emitting device 2 resulting from break of the second portion 32 due to vibrations generated during transportation of the semiconductor device 100. The material of sacrificial layer 5 may be different from the semiconductor light-emitting device 2, the bridge layer 3, the bonding structure 6, or the carrier 1, such that damages to the semiconductor light-emitting device 2, the bridge layer 3, the bonding structure 6, or the carrier 1 can be prevented in the process of removing the sacrificial layer 5. For example, the sacrificial layer 5 may be selectively etched by a solid-state or liquid-state etchant. In this embodiment, the material of sacrificial layer 5 includes silicon (Si) or zinc oxide (ZnO). The etchant may include $HNO_3$, HF, $CO_3COOH$ or a mixture thereof.

FIGS. 5A-5D show schematic views of manufacturing processes of the semiconductor device 100 or the semiconductor device 200.

Figure 5A:
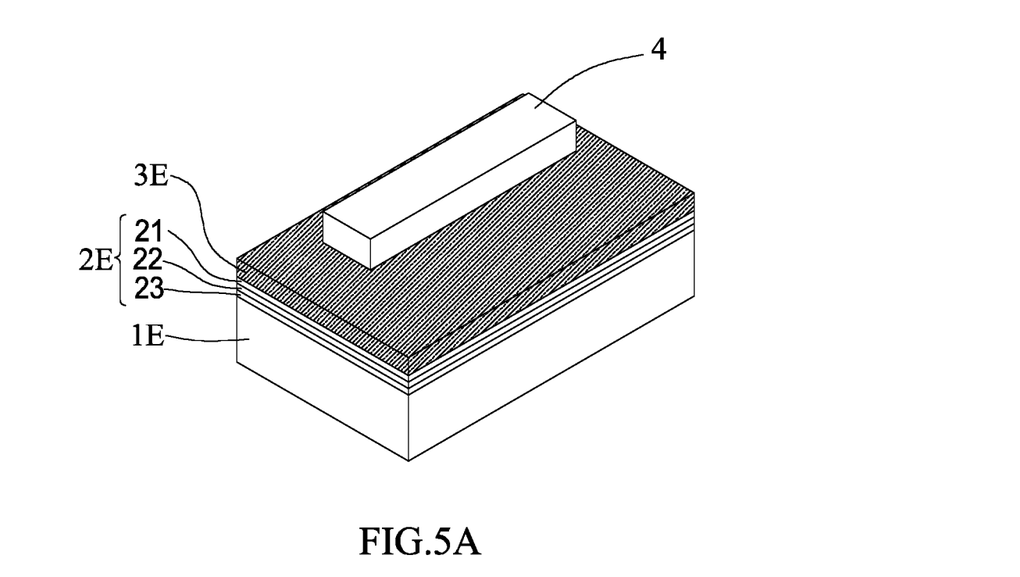
FIGS. 5A-5D show schematic views of manufacturing processes of the semiconductor device in FIG. 2A or the semiconductor device in FIG. 4A in accordance with an embodiment of the present disclosure.

As shown in FIG. 5A, a growth substrate 1E and a semiconductor epitaxial stack 2E grown on the growth substrate 1E are provided. The semiconductor epitaxial stack 2E may include a first semiconductor layer 21, a second semiconductor layer 23, and an active layer 22 located between the first semiconductor layer 21 and the second semiconductor layer 23. The growth substrate 1E may be a conductive substrate or an insulating substrate for epitaxial growth. A material of the growth substrate 1E may include an insulating material such as sapphire ($Al_2O_3$), or a conductive material such as GaAs, InP, Ge, Si, or GaN, but not limited thereto. A first layer 3E is formed on the semiconductor epitaxial stack 2E, and a supporting element 4 is formed on the first layer 3E. In FIG. 5A, only one supporting element 4 is shown; however, in an embodiment, a plurality of supporting elements 4 can be formed on the first layer 3E and the supporting elements 4 can form an array. The bridge layer 3 may be further formed from the first layer 3E. In an embodiment, the material and the thickness of the first layer 3E are the same as the above-mentioned thickness of the bridge layer 3.

Figure 5B:
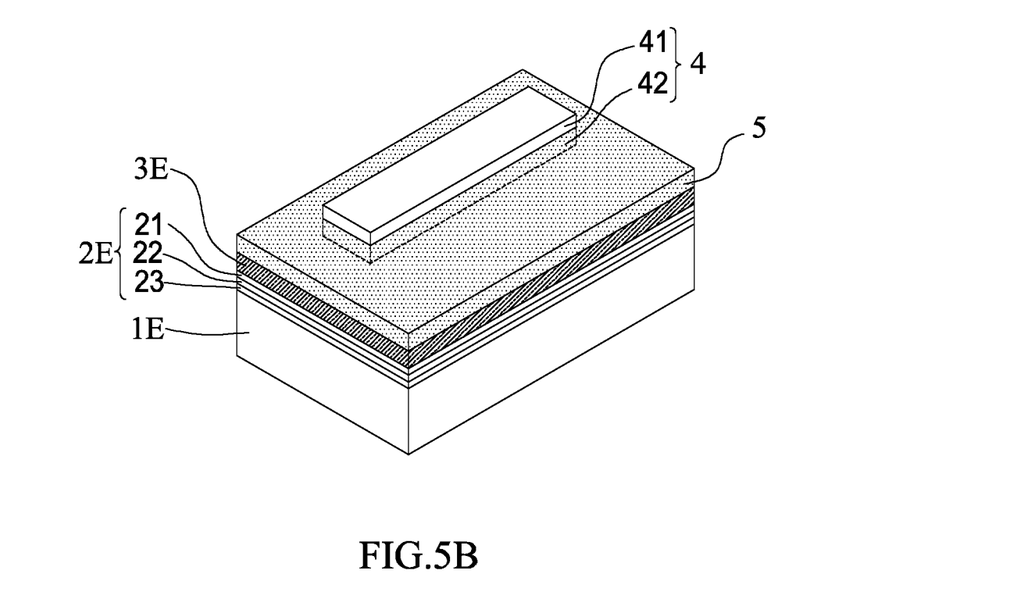

As shown in FIG. 5B, a sacrificial layer 5 may be formed on the first layer 3E and covers the supporting element 4. The sacrificial layer 5 may not completely cover the supporting element 4. Specifically, the sacrificial layer 5 may cover a portion of the supporting element 4. For example, the first portion 41 may not covered by the sacrificial layer 5 and may be exposed, and the second part 42 of the supporting element 4 is buried in the sacrificial layer 5. In an embodiment, the sacrificial layer 5 may have a thickness less than a thickness of the supporting element 4. In an embodiment, the sacrificial layer 5 may have a thickness the same as a thickness of the second part 42 in the supporting element 4.

Figure 5C:
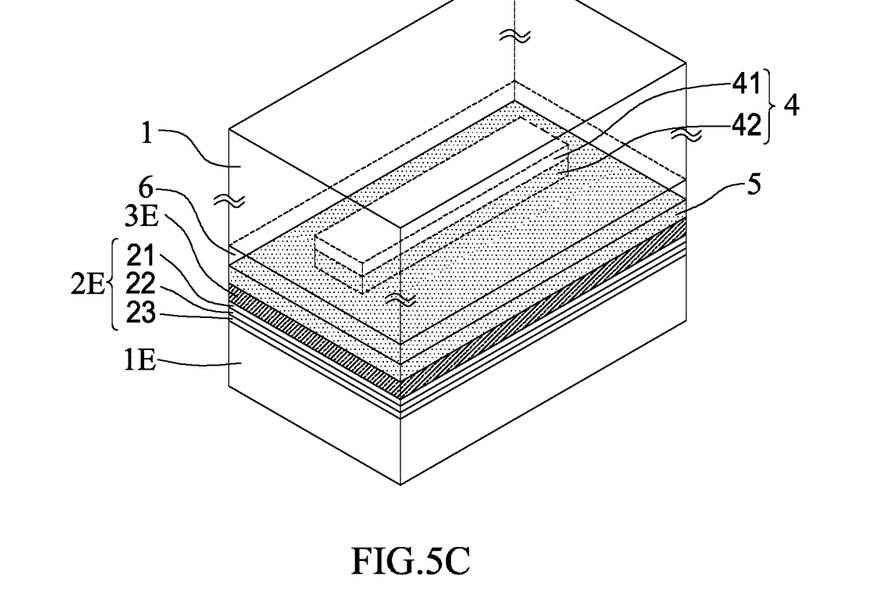

As shown in FIG. 5C, a carrier 1 is provided on the sacrificial layer 5, and a bonding structure 6 is provided between the carrier 1 and the sacrificial layer 5. A bonding process is performed to bind the carrier 1 to the sacrificial layer 5 via the bonding structure 6. The bonding process includes elevating the temperature and applying a pressure on the carrier 1 and the growth substrate 1E for a period of time. The pressure applied in the bonding process can be adjusted based on the melting point, alloy temperature or molecular size of the material of the bonding structure 6. In the embodiment, since the first part 41 of the supporting element 4 is not covered by the sacrificial layer 5 and is exposed, and the bonding structure 6 has a thickness larger than a thickness of the first part 41, the first part 41 is buried in the bonding structure 6.

Figure 5D:
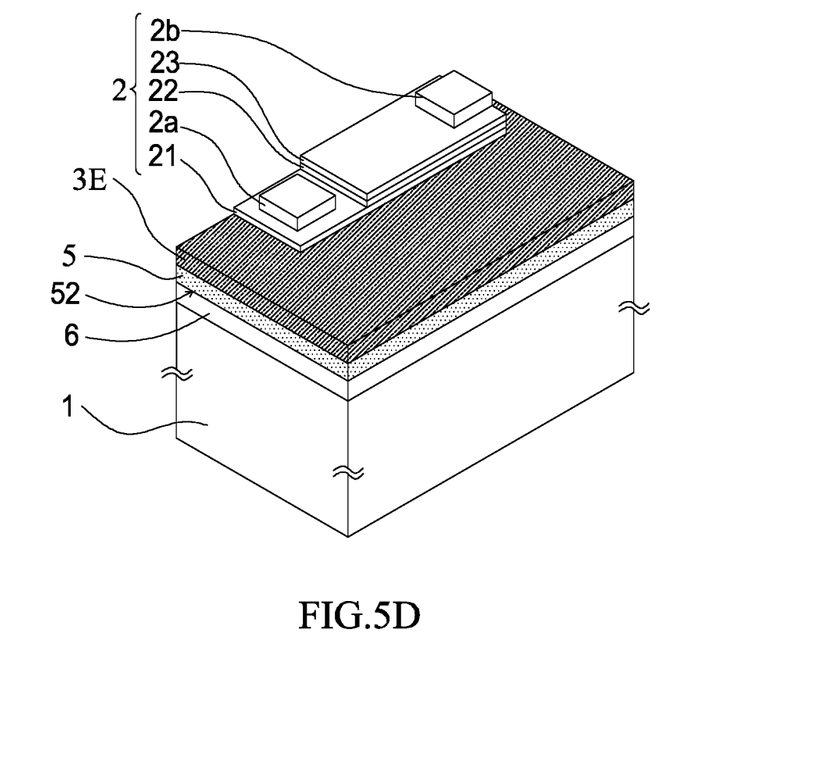

As shown in FIG. 5D, the structure shown in FIG. 5C is flipped over and the growth substrate 1E is removed. An etching process is further performed to remove a portion of the semiconductor epitaxial stack 2E and the first layer 3E is exposed. An electrode 2a is formed on the first semiconductor layer 21 and an electrode 2b is formed on the second semiconductor layer 23 to obtain a semiconductor light-emitting device 2. The method for removing the growth substrate 1E includes grinding, laser etching or other etching methods. In an embodiment, the etching process includes a plurality of patterning steps.

A patterning step can be performed on the first layer 3E to form a patterned first layer and expose the upper surface 51 of the sacrificial layer 5, as shown in the semiconductor device 200 of FIG. 4A and FIG. 4B. The patterned first layer can be the bridge layer 3. The patterning step may include wet etching or dry etching.

In an embodiment, the sacrificial layer 5 can be further removed by dry etching (such as gas etching) or wet etching, so as to form the semiconductor device 100 as shown in FIG. 2A.

Figure 6A:
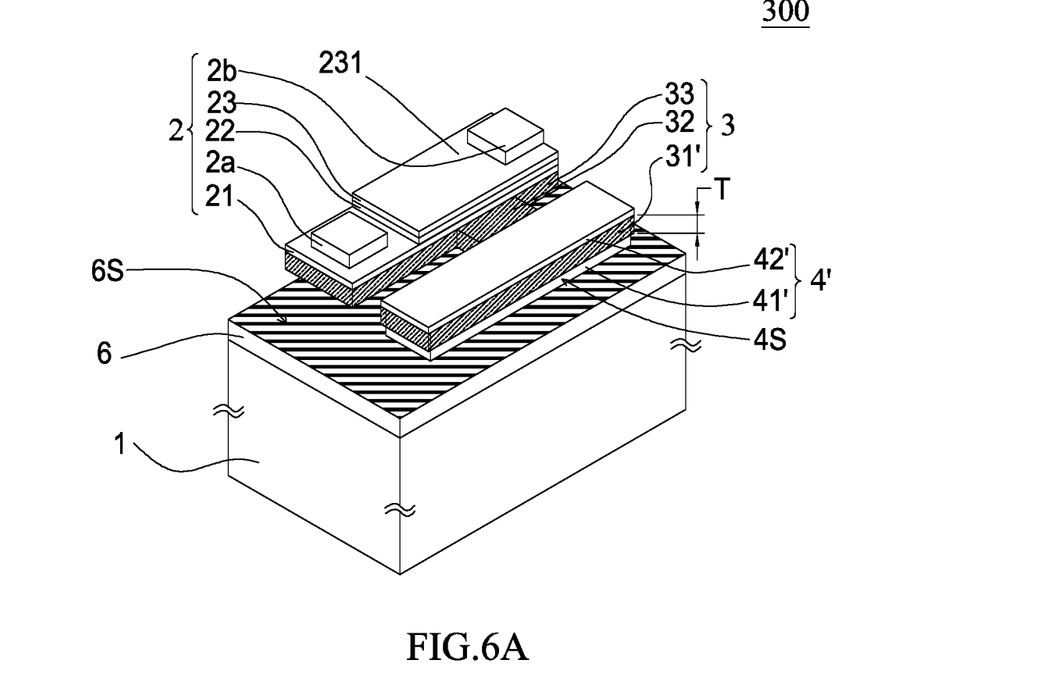
FIG. 6A shows a schematic view of a semiconductor device in accordance with an embodiment of the present disclosure.
Figure 6B:
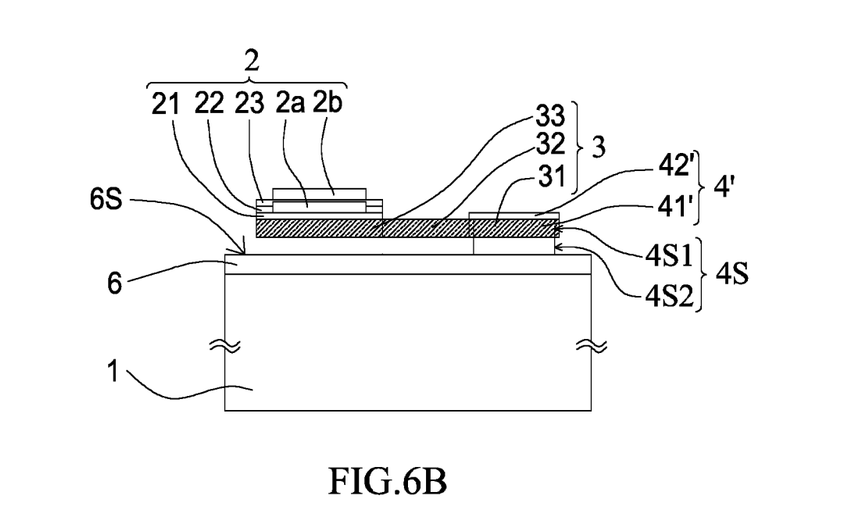
FIG. 6B shows a schematic side view of the semiconductor device in FIG. 6A in accordance with an embodiment of the present disclosure.
Figure 7:
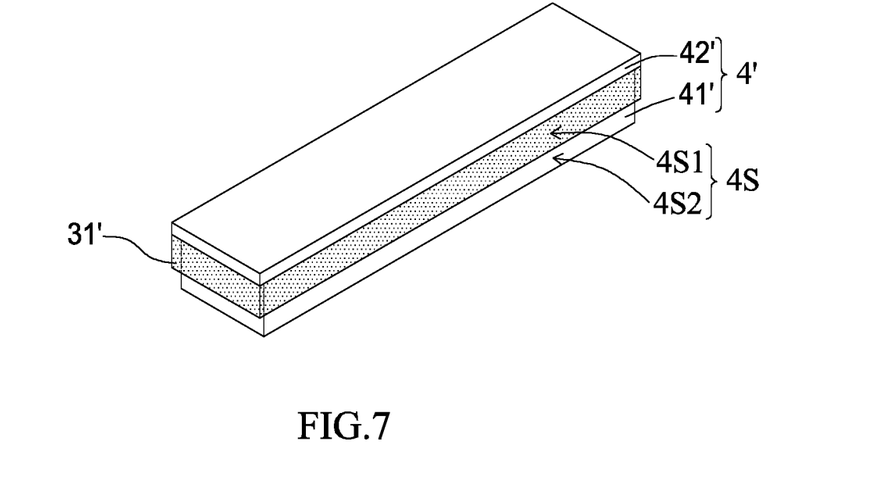
FIG. 7 shows a schematic view of a supporting element and a bridge layer of the semiconductor device in accordance with an embodiment of the present disclosure.

FIG. 6A shows a schematic view of a semiconductor device 300 in accordance with an embodiment of the present disclosure. FIG. 6B shows a schematic side view of the semiconductor device 300 in FIG. 6A. Similar to FIG. 2, only a single semiconductor device 300 is shown in FIG. 6A. However, referring to the schematic top view shown in FIG. 1, a plurality of semiconductor devices 300 may form an array form and may be fixed on the carrier 1 in an embodiment. The semiconductor device 300 may have a similar structure with semiconductor device 100. A difference between the semiconductor device 300 and the semiconductor device 100 is in the structures of the supporting element 4' and the first portion 31' of the bridge layer 3'. In the embodiment, the supporting element 4' includes the first part 41' and the second part 42' on the first part 41'. The first part 41' is on the surface 6S of the bonding structure 6 and has a side wall 4S. The second part 42' is on the first part 41' and extends over the side wall 4S of the first part 41'. The first portion 31' of the bridge layer 3 surrounds the first part 41' of the supporting element 4' and covers the side wall 4S. Specifically, as shown in FIG. 6B and FIG. 7, the first portion 31' of the bridge layer 3 surrounds and covers the upper side wall 4S1 of the first part 41', and directly contacts the second part 42' of the supporting element 4'. The first portion 31' of the bridge layer 3 does not surrounds the lower side wall 4S2 of the first part 41', such that the lower side wall 4S2 is exposed. Specifically, the first part 41' of the supporting element 4' may have a thickness larger than a thickness of the bridge layer 3.

Figure 8A:
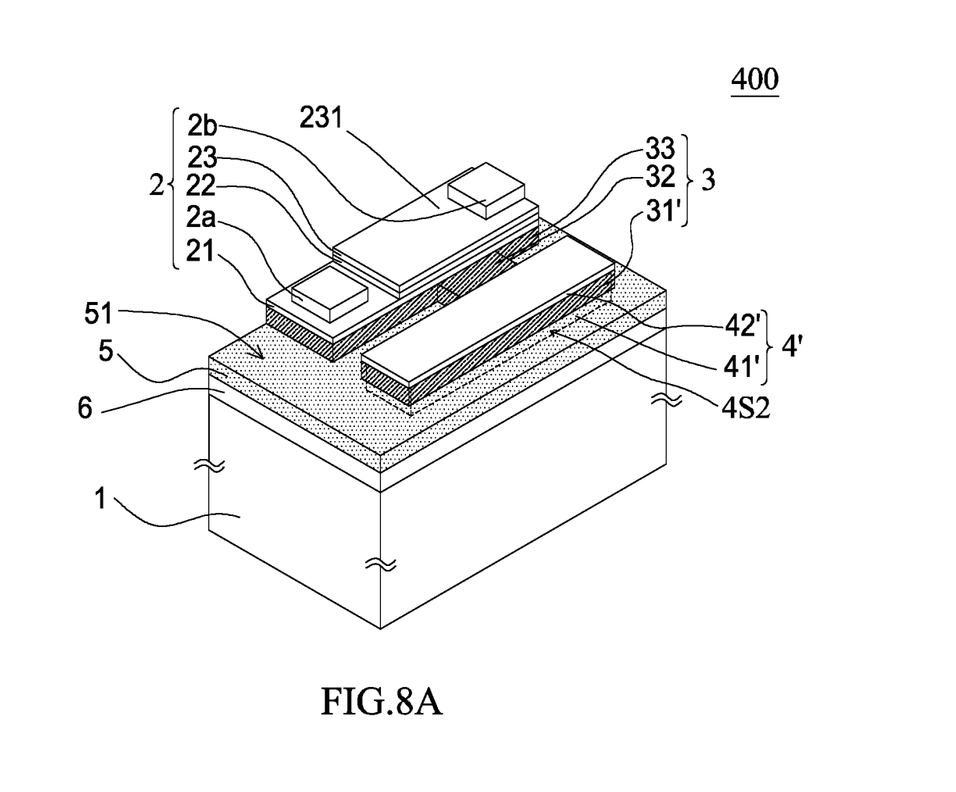
FIG. 8A shows a schematic view of a semiconductor device in accordance with an embodiment of the present disclosure.
Figure 8B:
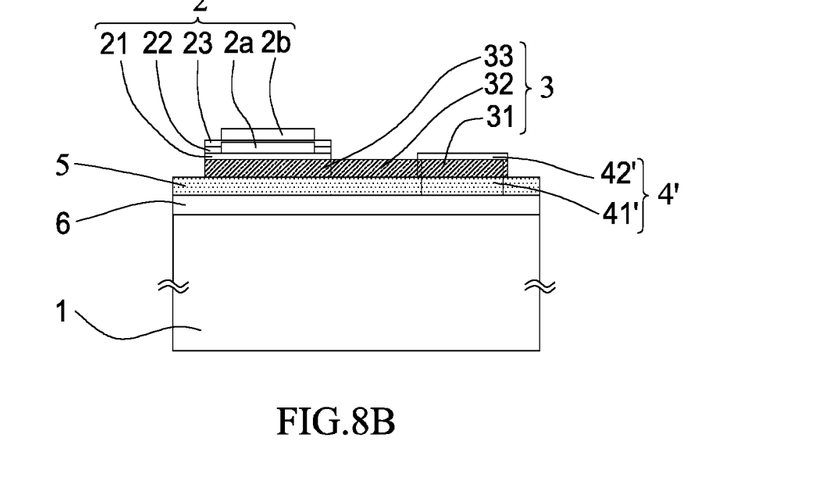
FIG. 8B shows a schematic side view of the semiconductor device in FIG. 8A in accordance with an embodiment of the present disclosure.

FIG. 8A shows a schematic view of a semiconductor device 400 in accordance with an embodiment of the present disclosure. FIG. 8B shows a schematic side view of the semiconductor device 400 in FIG. 8A. Similar to FIG. 6, only a single semiconductor device 400 is shown in FIG. 8A. However, referring to the schematic top view shown in FIG. 1, a plurality of semiconductor devices 400 may form an array form and may be fixed on the carrier 1 in an embodiment. The semiconductor device 400 may have a similar structure with the semiconductor device 300. A difference between the semiconductor device 400 and the semiconductor device 300 is in the sacrificial layer 5. In the embodiment, the sacrificial layer 5 is between the bonding structure 6 and the bridge layer 3, and the sacrificial layer 5 covers the exposed lower side wall 4S2 of the first part 41'. A lower surface of the sacrificial layer 5 directly contacts an upper surface of the bonding structure 6, and a lower surface of the bridge layer 3 directly contacts the upper surface 51 of the sacrificial layer 5. In practical application, the sacrificial layer 5 can be removed by dry etching (such as gas etching) or wet etching, such that the second portion 32 and the third portion 33 of the bridge layer 3 are suspended above the surface 6S of the bonding structure 6. Then, a pick-up process can be performed. The sacrificial layer 5 can be removed so as to expose the surface 6S of the bonding structure 6 and the first part 41' of the supporting element 4'. The final structure may be referred to the structure of the semiconductor device 300.

Since the production of the semiconductor device 300 and the pick-up process of the semiconductor light-emitting device 2 may be performed in different places, the sacrificial layer 5 can support the semiconductor light-emitting device 2 on the third portion 33 of the bridge layer 3, so as to avoid the detachment of the semiconductor light-emitting device 2 resulting from break of the second portion 32 due to vibrations generated during transportation of the semiconductor device 100. The material of sacrificial layer 5 may be different from the semiconductor light-emitting device 2, the bridge layer 3, the bonding structure 6 or the carrier 1, such that damages to the semiconductor light-emitting device 2, the bridge layer 3, the bonding structure 6 or the carrier 1 can be prevented in a process of removing the sacrificial layer 5. For example, the sacrificial layer 5 may be selectively etched by a solid-state or liquid-state etchant. In this embodiment, the material of sacrificial layer 5 includes silicon (Si) or zinc oxide (ZnO). The etchant may include $HNO_3$, HF, $CO_3COOH$ or a mixture thereof.

Figure 9A:
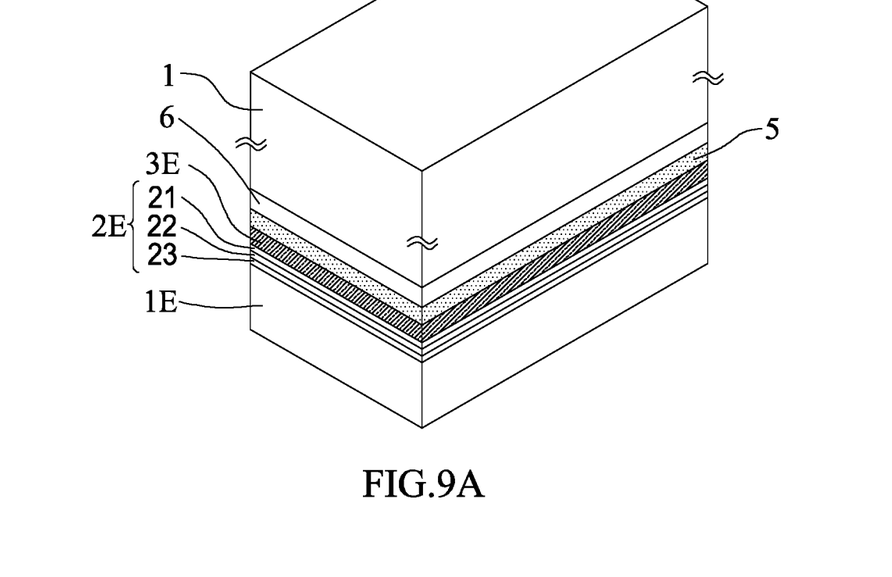
FIGS. 9A-9C show schematic views of manufacturing processes of the semiconductor device in FIG. 6A or the semiconductor device in FIG. 8A in accordance with an embodiment of the present disclosure.
Figure 9B:
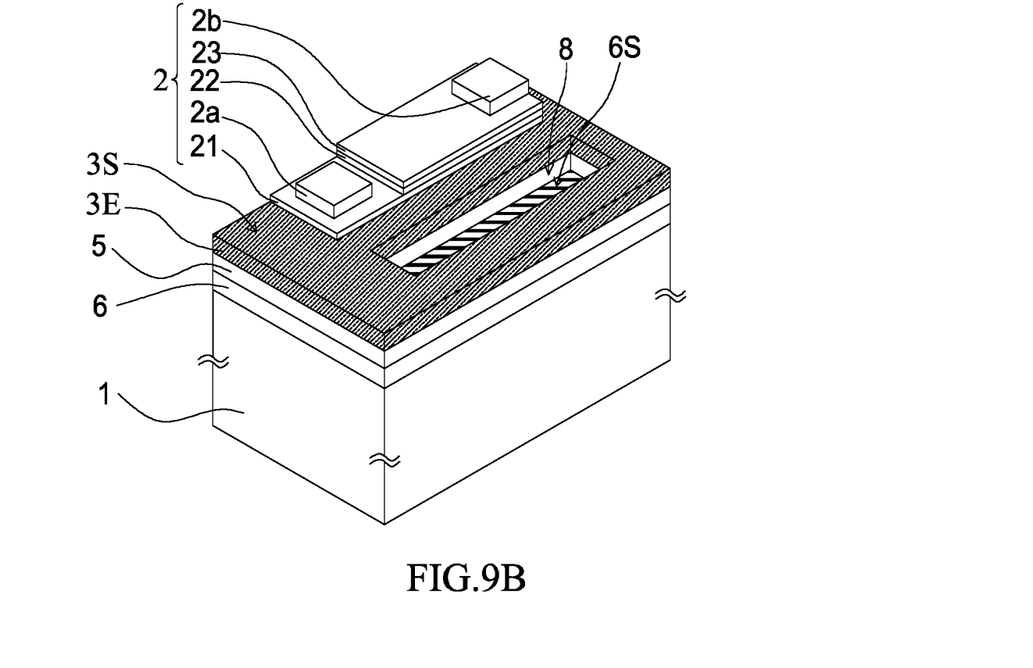
Figure 9C:
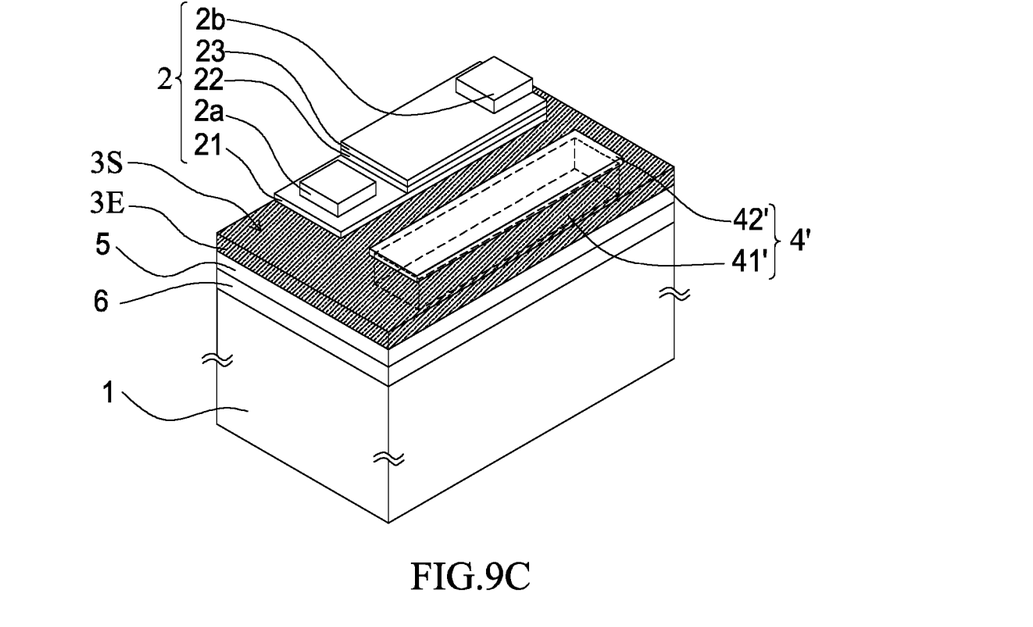

FIGS. 9A-9C show schematic views of manufacturing processes of the semiconductor device 300 or the semiconductor device 400 in accordance with an embodiment of the present disclosure.

As shown in FIG. 9A, a growth substrate 1E and a semiconductor epitaxial stack 2E grown on the growth substrate 1E are provided. The semiconductor epitaxial stack 2E may include a first semiconductor layer 21, a second semiconductor layer 23, and an active layer 22 located between the first semiconductor layer 21 and the second semiconductor layer 23. The growth substrate 1E may be a conductive substrate or an insulating substrate for epitaxial growth. A material of the growth substrate 1E may include an insulating material such as sapphire ($Al_2O_3$), or a conductive material such as GaAs, InP, Ge, Si, or GaN, but not limited thereto. A first layer 3E is formed on the semiconductor epitaxial stack 2E. The bridge layer 3 may be further formed from the first layer 3E. A sacrificial layer 5 is formed on the first layer 3E. A carrier 1 is further provided on the sacrificial layer 5, and a bonding structure 6 is provided between the carrier 1 and the sacrificial layer 5. Then, a bonding process is performed to bind the carrier 1 to the sacrificial layer 5 via the bonding structure 6. The bonding process includes elevating the temperature and applying a pressure on the carrier 1 and the growth substrate 1E for a period of time. The pressure applied in the bonding process can be adjusted based on melting point, alloy temperature, or molecular size of the material of the bonding structure 6. The material or structures of the growth substrate 1E, the first semiconductor layer 21, the active layer 22, the second semiconductor layer 23, the first layer 3E, the sacrificial layer 5, the bonding structure 6 or the carrier 1 may be the same as mentioned in previous embodiments.

As shown in FIG. 9B, the structure in FIG. 9A is flipped over and the growth substrate 1E is removed. An etching process is performed to remove a portion of the semiconductor epitaxial stack 2E and the first layer 3E is exposed. An electrode 2a is formed on the first semiconductor layer 21, and an electrode 2b is formed on the second semiconductor layer 23 to obtain a semiconductor light-emitting device 2. The method for removing the growth substrate 1E includes grinding, laser etching or other etching methods. In an embodiment, the etching process includes a plurality of patterning steps.

Then, as shown in FIG. 9B, the first layer 3E is patterned from the surface 3S to form a hole 8 which can define a position for forming the supporting element 4. In an embodiment, a plurality of holes 8 may be formed in the first layer 3E. As shown in the top view of FIG. 1, every semiconductor light-emitting device 2 may correspond to one supporting element 4; therefore, each hole 8 may correspond to one semiconductor light-emitting device 2. In this embodiment, the hole 8 penetrates the first layer 3E and the sacrificial layer 5, and the surface 6S of the bonding structure 6 is exposed.

As shown in FIG. 9C, a supporting element 4' is formed in the hole 8. In this embodiment, the first part 41' of the supporting element 4' completely fills the hole 8, the second part 42' extends from and covers the hole 8, and a portion of the surface 3S is also covered by the second part 42'. A patterning step can be performed on the first layer 3E to obtain a patterned first layer and the upper surface 51 of the sacrificial layer 5 is exposed, as shown in the semiconductor device 400 of FIG. 8A and FIG. 8B. The patterned first layer can be the bridge layer 3. The patterning step may include wet etching or dry etching.

In an embodiment, the sacrificial layer 5 can be further removed by dry etching (such as gas etching) or wet etching, so as to form the semiconductor device 300 as shown in FIGS. 6A and 6B.

Figure 10A:
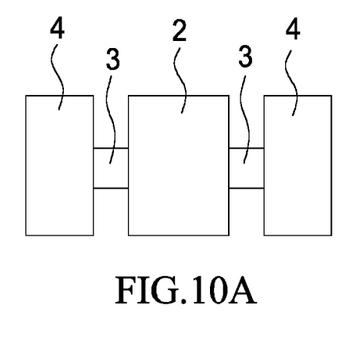
FIGS. 10A-10C show schematic top views of semiconductor devices in accordance with some embodiments of the present disclosure.
Figure 10B:
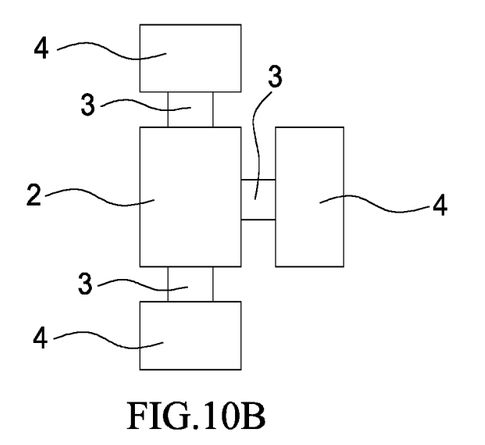
Figure 10C:
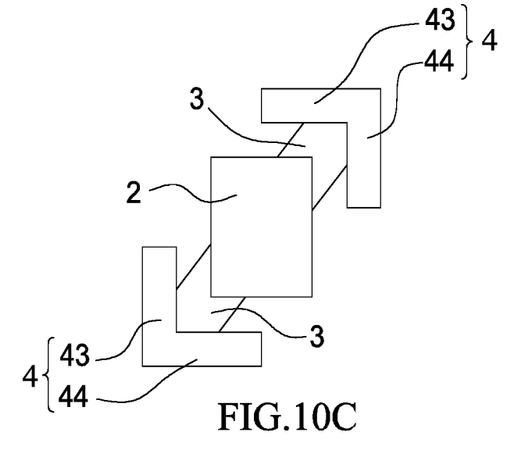

FIGS. 10A-10C show schematic top views of semiconductor devices in accordance with some embodiments of the present disclosure. Similar to FIG. 2B, only a single semiconductor device is shown in FIGS. 10A-10C. However, referring to the schematic top view shown in FIG. 1, a plurality of semiconductor devices may form an array and may be fixed on the carrier in an embodiment. The semiconductor light-emitting device 2, the bridge layer 3 or the supporting element 4 may be square-shaped, L-shaped or in an irregular shape. Regarding the detailed structures of the semiconductor light-emitting device 2, the bridge layer 3, and the supporting element 4, FIG. 2A, FIG. 4A, FIG. 6A, FIG. 8A and other related paragraphs in the present disclosure can be referred to. Specifically, the shapes and numbers of the bridge layer 3 and the supporting element 4 may be altered depending on the actual situation.

As shown in FIG. 10A, the semiconductor device may include one semiconductor light-emitting device 2, two bridge layers 3, and two supporting elements 4. The two supporting elements 4 are respectively located on two opposite sides of the semiconductor light-emitting device 2, and respectively connected to the semiconductor light-emitting device 2 through one of the two bridge layers 3.

As shown in FIG. 10B, the semiconductor device may include one semiconductor light-emitting device 2, three bridge layers 3, and three supporting elements 4. The semiconductor light-emitting device 2 is square-shaped and has four sides. The three supporting elements are respectively located on three sides out of the four sides in the semiconductor light-emitting device 2, and each of the three supporting elements are respectively connected to the semiconductor light-emitting device 2 through one of the three bridge layers 3.

As shown in FIG. 10C, the semiconductor device may include one semiconductor light-emitting device 2, two bridge layers 3, and two supporting elements 4. The two supporting elements 4 are respectively located on two diagonal corners of the semiconductor light-emitting device 2 and are respectively connected to the semiconductor light-emitting device 2 through one of the two bridge layers 3. Each supporting element 4 has a first region 43 and a second region 44. The first region 43 and the second region 44 may form an L-shaped pattern. The first region 43 may extend along a width direction of the semiconductor light-emitting device 2, and the second region 44 may extend along a length direction of the semiconductor light-emitting device 2. The bridge layer 3 may be connected to the first region 43 and the second region 44 at the same time.

Based on above, by connecting a plurality of supporting elements 4 to the semiconductor light-emitting device 2, the force for supporting the semiconductor light-emitting device 2 through the supporting element 4 can be strengthened, and the stability of the semiconductor device can be elevated.

It should be realized that each of the embodiments mentioned in the present disclosure is only used for describing the present disclosure, but not for limiting the scope of the present disclosure. Any obvious modification or alteration is not departing from the spirit and scope of the present disclosure. Same or similar components in different embodiments or components having the same numerals in different embodiments may have same physical or chemical characteristics. Furthermore, above-mentioned embodiments can be combined or substituted under proper condition and are not limited to specific embodiments described above. A connection relationship between a specific component and another component specifically described in an embodiment may also be applied in another embodiment and is within the scope as claimed in the present disclosure.

What is claimed is:
1. A semiconductor structure, comprising:
a carrier having an upper surface;
a supporting element on the upper surface of the carrier;
a semiconductor stack on the upper surface of the carrier and having a side surface and a lower surface; and
a bridge layer having a first portion directly connected to the supporting element, a second portion, and a third portion located under and directly connected to the lower surface of the semiconductor stack;
wherein the second portion is extended from the third portion toward the first portion and is protruded from the side surface of the semiconductor stack.
2. The semiconductor structure of claim 1, wherein the first portion, the second portion and the third portion are at the same height level.
3. The semiconductor structure of claim 1, wherein there is no solid supporting material between the second portion and the upper surface of the carrier or between the third portion and the upper surface of the carrier.
4. The semiconductor structure of claim 1, wherein the third portion is located between the semiconductor stack and the upper surface of the carrier, and is overlapped with the semiconductor stack in a vertical direction.
5. The semiconductor structure of claim 1, wherein the second portion and the third portion are suspended above the upper surface of the carrier by the first portion and the supporting element.
6. The semiconductor structure of claim 1, wherein the first portion of the bridge layer surrounds the supporting element.
7. The semiconductor structure of claim 1, further comprising a sacrificial layer between the upper surface of the carrier and the bridge layer.
8. The semiconductor structure of claim 7, wherein the supporting element has a first part and a second part, the second part is on the first part and the second part is buried in the sacrificial layer.
9. The semiconductor structure of claim 7, wherein the sacrificial layer comprises a material different from a material of the semiconductor stack.
10. The semiconductor structure of claim 7, wherein the sacrificial layer comprises a material different from a material of the bridge layer.
11. The semiconductor structure of claim 7, wherein the supporting element has a first thickness and the sacrificial layer has a second thickness less than the first thickness.
12. The semiconductor structure of claim 1, further comprising a bonding structure between the upper surface of the carrier and the supporting element.
13. The semiconductor structure of claim 12, wherein the supporting element has a first part and a second part, the second part is on the first part, and the first part is buried in the bonding structure.
14. The semiconductor structure of claim 1, wherein the second portion has a length and a thickness less than the length.
15. The semiconductor structure of claim 14, wherein a ratio of the thickness to the length is 0.05 to 1.
16. A semiconductor structure, comprising:
a bridge layer comprising a first connecting portion and a second connecting portion; and
a semiconductor stack on the first connecting portion, having a side surface and comprising an active layer;
wherein in a top view of the semiconductor structure, the first connecting portion has a first length and a first width, the second connecting portion has a second length and a second width, the second length is less than the first length and the second width is less than the first width, and the second connecting portion is extended from the first connecting portion and is protruded from the side surface of the semiconductor stack.
17. The semiconductor structure of claim 16, wherein the semiconductor stack further comprises a first semiconductor layer with a first width and a second semiconductor layer with a second width equal to the first width.
18. The semiconductor structure of claim 17, wherein the first semiconductor layer has a third length and the second semiconductor layer has a fourth length longer than the third length.
19. The semiconductor structure of claim 16, wherein the bridge layer comprises an oxide or a nitride.
20. A semiconductor structure, comprising:
a carrier having an upper surface; and
a plurality of semiconductor devices on the upper surface of the carrier and forming an array, and each of the plurality of semiconductor devices comprising:
a supporting element;
a semiconductor stack having a side surface and a lower surface; and a bridge layer having a first portion directly connected to the supporting element, a second portion, and a third portion located under and directly connected to the lower surface of the semiconductor stack;

wherein the second portion is extended from the third portion toward the first portion and is protruded from the side surface of the semiconductor stack.

\* \* \* \* \*